United States Patent [19]
Pai et al.

[11] Patent Number: 5,740,954
[45] Date of Patent: Apr. 21, 1998

[54] APPARATUS FOR ATTACHING/DETACHING A LAND GRID ARRAY COMPONENT TO A CIRCUIT BOARD

[75] Inventors: Deepak Keshav Pai, Burnsville, Minn.; Allen Lee Bringewatt, Grantsburg, Wis.

[73] Assignee: General Dynamics Information Systems, Inc., Falls Church, Va.

[21] Appl. No.: 699,570

[22] Filed: Aug. 19, 1996

[51] Int. Cl.⁶ .................. H05K 3/34; B23K 3/00
[52] U.S. Cl. ............. 228/40; 228/56.1; 228/264
[58] Field of Search .................. 228/19, 40, 49.5, 228/56.1, 56.2, 119, 191, 259, 264

[56] References Cited

U.S. PATENT DOCUMENTS

| | | |
|---|---|---|
| 99,410 | 2/1870 | Covell . |
| 767,465 | 8/1904 | Wirth et al. . |
| 812,329 | 2/1906 | Daugherty . |
| 1,947,689 | 2/1934 | Young . |
| 2,344,589 | 3/1944 | Bogner . |
| 2,619,063 | 11/1952 | Anderson . |
| 2,771,049 | 11/1956 | Fish . |
| 3,522,836 | 8/1970 | King .................. 164/87 |
| 3,684,151 | 8/1972 | Burman et al. .......... 288/19 |
| 4,047,655 | 9/1977 | McCafferty ............ 228/259 |
| 4,561,584 | 12/1985 | Hug .................. 228/264 |
| 4,782,991 | 11/1988 | Breu ................. 228/264 |
| 4,827,611 | 5/1989 | Pai et al. ............. 29/843 |
| 4,942,997 | 7/1990 | Sinkunas et al. ....... 228/264 |
| 5,419,481 | 5/1995 | Lasto et al. .......... 228/6.2 |

*Primary Examiner*—Samuel M. Heinrich
*Attorney, Agent, or Firm*—Kinney & Lange, P.A.

[57] ABSTRACT

A system is provided for selectively attaching or detaching a land grid array component to a surface of circuit board where the attachment is a grid array of solid conductive solder beads or balls. A chamber contains an inert liquid, and a heater heats the inert liquid to a temperature above the melting temperature of the solder beads. A fluid level adjustment means adjusts the level of the inert liquid in the chamber between a first level below the component and a second level above the component. A first mounting means supports the circuit board above the component, and a second mounting means is positioned at least partially in the container to support the component below the circuit board and to bias the component against the circuit board. An component/board assembly is positioned in the system. The beads are uniformly melted by raising the level of the inert liquid in the chamber to above the component to permit removal of the board. The beads of the grid array resolidify by lowering the level of the inert liquid in the chamber to below the component while the second mounting means biases the component against the circuit board, thereby reflowing the solder and establishing the solid conductive connections of the grid array.

6 Claims, 2 Drawing Sheets

APPARATUS FOR ATTACHING/DETACHING A LAND GRID ARRAY COMPONENT TO A CIRCUIT BOARD

BACKGROUND OF THE INVENTION

This invention relates to apparatus for attaching or detaching a land grid array component to a circuit board.

Circuit boards ordinarily include circuit patterns or traces printed on various layers internal to the board and/or on one or both sides. Components are ordinarily mounted on one side of the board and electrically connected to the circuit patterns. Prior to the introduction of surface mount and land grid array components, it was common to mount components to a circuit board and extend leads from the components through plated-through holes in the circuit board to mounting pads on the opposite side. The plated-through holes were electrically connected to desired locations on the circuit pattern. The component leads were ordinarily arranged in a pattern along the edges of the component. The ends of the component leads were soldered to the pads on the opposite side of the board to establish mechanical and electrical connection to the board and circuit pattern. The arrangement provided satisfactory mechanical and electrical connection of the component to the circuit board. Soldering apparatus was developed to simultaneously connect all of the ends of the leads of a component to the pads opposite the circuit pattern. These soldering apparatus employed a solder bath to solder the leads. Ordinary, a template or other guide was used to direct the molten solder to the desired positions on the circuit board for connecting the component leads that extend through the through holes to the circuit board. An example of such apparatus is found in U.S. Pat. No. 3,684,151 for "Solder Machine" issued Aug. 15, 1972 to Burman et al.

Surface mounted components were developed for mounting and connecting to one side of the board. In one form of surface mounted components, leads extend from along the edges of the component for attachment to pads on the circuit board. In another form of surface mounted components, compliant leads were attached to pads along the edges of the component and to pads on the circuit board. An example of a surface mounted component employing compliant leads may be found in U.S. Pat. No. 4,827,611 granted May 9, 1989 for "Compliant S-Leads for Chip Carriers" by D. K. Pal et al. and assigned to the same assignee as the present invention. Apparatus was developed that permitted reflow of solder on the leads for connection to the circuit board pads and to the component pads (for compliant leads). The reflow apparatus directed heat along the edges of the component between the component and the circuit board to uniformly heat the solder connections and reflow the solder. The apparatus heated all of the solder connections simultaneously, thereby substantially simultaneously reflowing the solder connections between the surface mounted component and the circuit pads.

Land grid array components are a class of surface mounted components that employ a grid array of solder connections on a surface of the component. The grid array is not limited to the edges of the component, but instead are disbursed across the surface in spaced relation in an area array, usually uniform. Land grid array components include ball grid array components, solder grid array components and column grid array components. The surface bearing the land grid array is positioned to confront an identical grid array of circuit pads on a circuit board, and the solder beads, balls or columns are heated to reflow to attach or detach the component from the circuit board. These devices, like other surface mounted components, require simultaneous reflow of all solder connections to the circuit board. However, conventional solder/desolder machines were not capable of uniformly heating the solder connections of the component. More particularly, the lack of a uniform heating pattern resulted in the failure to uniformly melt all of the solder balls or columns of the land grid array substantially simultaneously.

Air-Vac of Seymour, Conn. developed apparatus intended to perform simultaneous reflow of the solder connections between a land grid array component and a circuit board. This apparatus, known as the DRS22 reflow system, is partially described in U.S. Pat. No. 5,419,418 and is partially diagrammatically illustrated in FIG. 1. The Air-Vac system includes a housing 10 having a lower surface 12 arranged to abut a surface 14 of printed wiring board 16. Block 18 in housing 10 includes passages 20 between an upper chamber 22 and a lower chamber 24, the lower chamber receiving land grid array component 26. Hot gas, such as air, is forced into chamber 22 and through passages 20 on three sides of block 18. The hot air enters the space of the land grid array between the printed wiring board 16 and component 26. The hot air enters on three sides and exits on the fourth side through opening 28 in housing 10. Printed wiring board 16 is supported on a platform that may itself be heated. The hot air forced through the land grid array melts the solder, thereby allowing ready attachment or detachment of the component from the printed wiring board. The Air-Vac system also includes a microscope and camera to permit the operator to view the progress of the operation within chamber 24, the camera permitting display of the operation on a display unit.

One problem with the Air-Vac system is that the flowing gas does not rapidly heat the solder of the land grid array. More particularly, the heat transfer between a gas and a solid is not as rapid as, say, between a more dense fluid and the same solid. As a result, the process employing the Air-Vac apparatus takes a considerable amount of time, up to three to four minutes. The circuit board is heated to about 100° C., which is difficult to maintain over a large board surface. Moreover, in the Air-Vac apparatus, the heat transfer is concentrated at three of the edges of the land grid array, resulting in some of the connections joints becoming overheated. Overheating of the solder joints results in an alteration of the grain size of the solder joints, and the solder joint grain size is not uniform across the entire grid array. Moreover, heat concentration at the three edges of the land grid array causes warpage in the circuit board due to uneven heating of the board in the region of the component.

SUMMARY OF THE INVENTION

The present invention is a system for selectively attaching or detaching a land grid array component to a first surface of circuit board. The component is arranged for surface mounting to the first surface by a land grid array of solid conductive connections, such as solder beads, balls or columns, that establish electrical conduction between the component and the circuit board and provide mechanical support for the component on the circuit board. The solder beads have a predetermined melting temperature so that upon melting and resolidifying the beads form the solid conductive connections that establish mechanical and electrical connection between the component and the circuit board. A chamber contains an inert liquid. A heater heats the inert liquid to a temperature above the melting temperature of the solder beads, and a fluid level adjustment means adjusts the level of the inert liquid in the chamber between a first level below the component and a second level above the component. A first mounting means supports the circuit board above the liquid, and a second mounting means is positioned at least partially in the container to support the component below the circuit board and to bias the component against the circuit board.

To detach a component from a circuit board, the first mounting means supports the circuit board so that the component attached to the circuit board is below the circuit board and in the container. The solder beads of the land grid array are uniformly melted by raising the level of the inert liquid in the chamber from its first level to its second level. The circuit board may be removed from the first mounting means leaving the component supported by the second mounting means.

To attach a component to a circuit board, the first and second mounting means are arranged so that component is supported in the chamber with the solder beads of the land grid array sandwiched between the component and the circuit board. The beads are uniformly melted by raising the level of the inert liquid in the chamber from its first level to its second level. The beads of the land grid array resolidify by lowering the level of the inert liquid in the chamber from its second level to its first level while the second mounting means biases the component against the circuit board, thereby establishing the solid conductive connections of the land grid array.

One feature of the system resides in the use of spring mounts for the second mounting means. These mounts support the component parallel to level of the inert liquid in the chamber and are compliant to adjust for variations in heights of the pads on the component and board, as well as for changes due to melting of the solder during reflow. Additionally, the spring mount supports the component after it is removed from the circuit board when the system is operated to detach a component from a circuit board, and biases the component against the circuit board when the system is operated to attach a component to a circuit board.

DETAILED DESCRIPTION OF THE PREFERRED EMBODIMENTS

Figure 1:
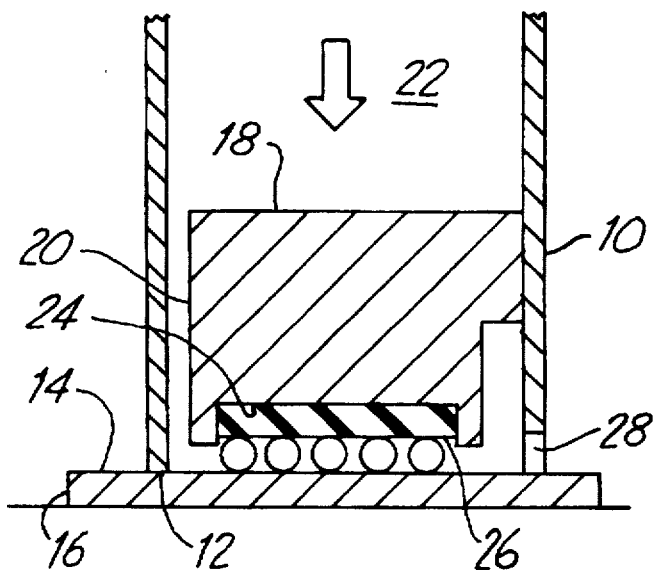
FIG. 1 is a section view of a portion of a prior art apparatus for working surface mounted components such as land grid array components to circuit boards.
Figure 3:
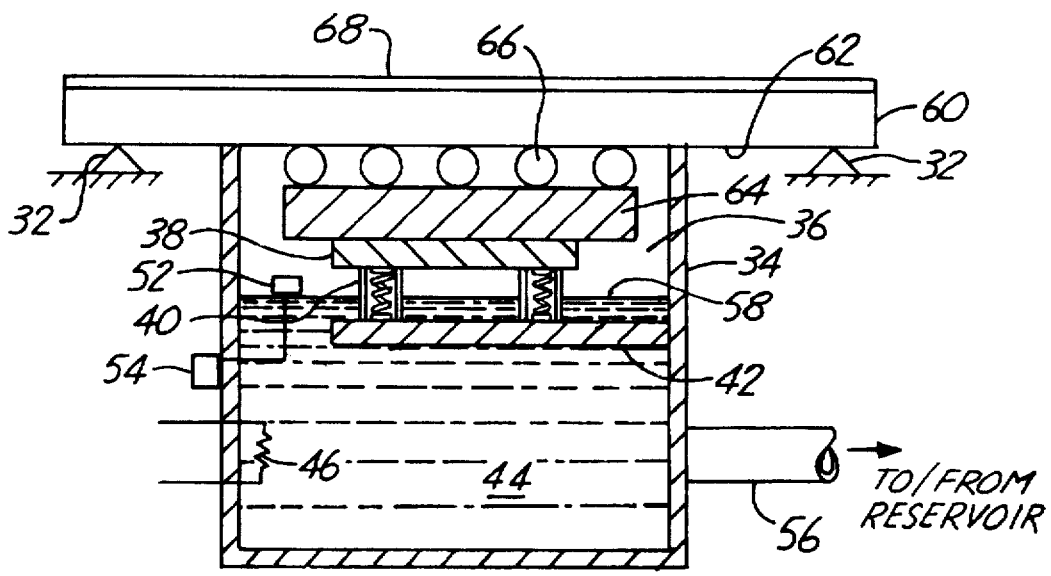
FIG. 3 is a section view illustrating the principles of the apparatus illustrated in FIG. 2.
Figure 2:
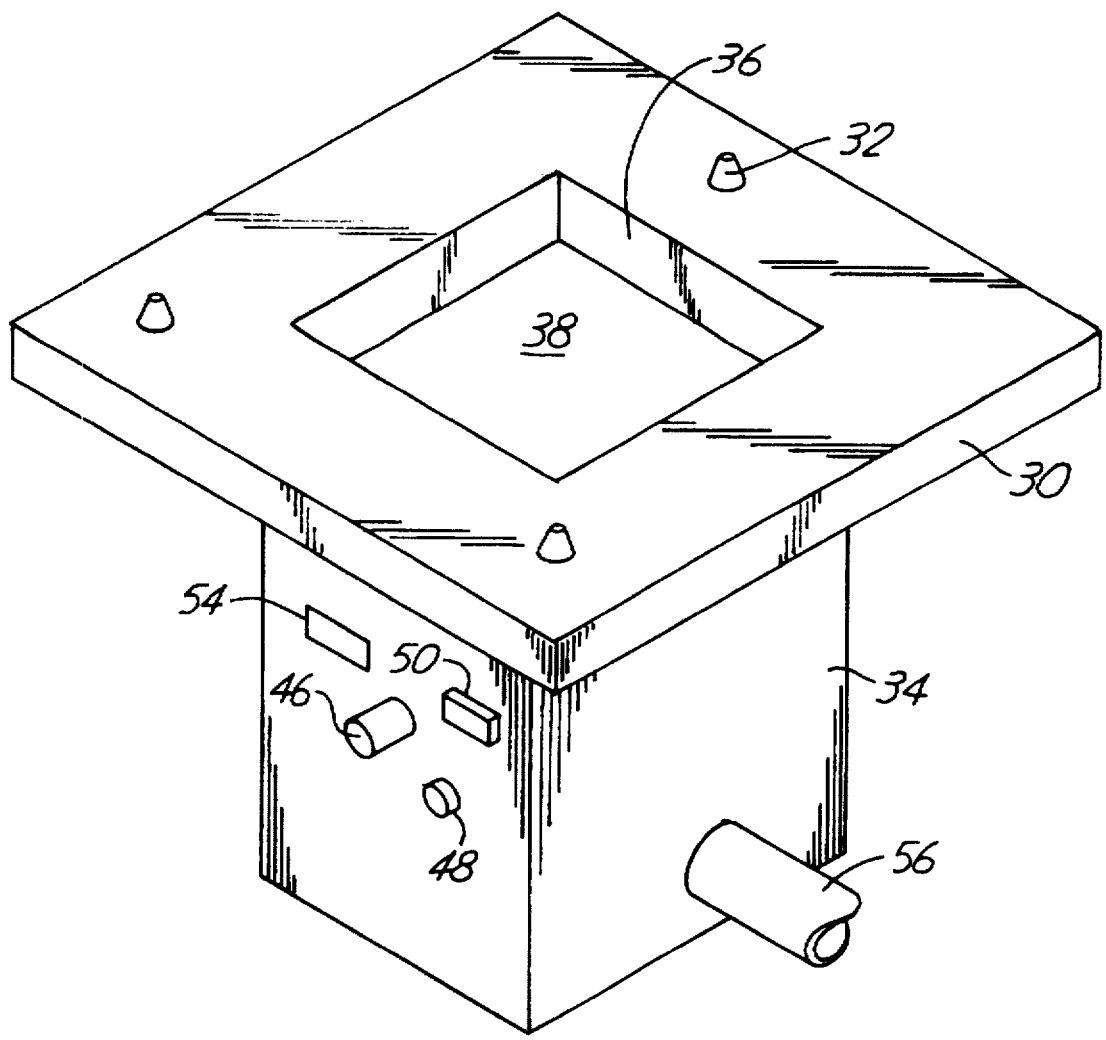
FIG. 2 is a perspective view of an apparatus for working surface mount components in accordance with the presently preferred embodiment of the present invention.

FIG. 2 is perspective view of apparatus for attaching/ detaching a land grid array component to a circuit board. The apparatus includes a housing 30 having support points 32 for supporting a printed circuit board 60 (FIG. 3). Supports 32 are preferably adjustable to permit alteration of the orientation of the circuit board with respect to the housing. Lower portion 34 of housing 30 defines a chamber 36 in which platform 38 is mounted. As shown particularly in FIG. 3, platform 38 is mounted to bracket 42 by a resilient mechanism such as springs 40. Bracket 42 is mounted to portion 34 of housing 30. Chamber 36 contains an inert liquid 44 which is heated by heater 46. One suitable inert liquid that is used for solder reflow and exhibits a boiling point in excess of 300° C. is "Fluoroinert," commercially available from Minnesota Mining and Manufacturing Company of St. Paul, Minn., Preferably, heater 46 is electrically operated and is controlled by control knob 48 (FIG. 2) connected to a rheostat control in a manner well known in the art. Indicator 50 provides an display to the operator of the temperature of liquid 44. Indicator 50 is connected to a thermostat (not shown) within chamber 36. Float 52 is connected to indicator 54 to provide a display to the operator indicative of the level of liquid 44 within chamber 36. Conduit 56 provides fluid communication to a reservoir (not shown) of liquid. The reservoir includes a displacement piston (not shown) to controllably transfer a controlled volume of liquid from the reservoir to chamber 36. The displacement piston is controllable to accurately control the volume of liquid 44 within chamber 36, and hence the height of the top surface 58 of the liquid.

In operation, printed wiring board 60 is positioned on supports 32 so that surface 62, to which component 64 is to be attached, is parallel to the surface 58 of liquid 44 within chamber 36. More particularly, supports 32 are adjusted to assure that surface 62 of the board is parallel to surface 58 of the liquid. The inert liquid in chamber 31 is heated, preferably to about 215° C. To detach component 64 from circuit board 62, the assembly is placed in the apparatus so that board 60 is supported on supports 32 and component 64 bears against support 38. Springs 40 bias component 64 toward circuit board 62. Preferably, the springs forming the bias force are independent of each other so that the position of the component conforms to varying levels of connection pads on the component and circuit board. Weights or other counter forces may be applied to board 60 to counter the bias force of springs 40, as well as any buoyancy effects of the liquid to be raised within chamber 36. The displacement piston within the reservoir attached to conduit 56 is operated to raise the liquid level 58 within chamber 36 so that the hot inert liquid contacts the solder connections of land grid array 66 to thereby melt the solder forming the land grid array. Circuit board 60 is then be lifted off and separated from component 64, leaving component 64 resting on support 38. The piston within the reservoir is then be operated to withdraw liquid from chamber 36 through conduit 56 there by lowering the level 58 of liquid within chamber 36 to below the component, to permit removal of the component.

To attach a component to a circuit board or to reflow solder connections between a component and a circuit board, the component is placed on support 38 within chamber 36 such that the land grid array 66 is facing upwardly. Printed wiring board 60 is positioned on support 32 so that surface 62 is parallel to the surface 58 of the liquid within chamber 36 and so that the contacts on the circuit board align with the land grid array. As in the case of detachment, a counter force may be necessary to counter the bias effects of springs 40 and any buoyancy effects of the liquid on the component. The level of heated inert liquid within chamber 36 is raised to the land grid array 66 causing the solder of the land grid array to reflow, thereby establishing electrical and mechanical connection between component 64 and the contacts on surface 62 of printed wiring board 60. Noteworthy, the internal printed wiring, as well as the printed wiring 68 on board 66 are unaffected by the process. Also noteworthy, the inert liquid permits an even application of heat to the land grid array, thereby assuring that the solder of the land grid array does not form uneven grain joints and assuring that circuit board 60 is evenly heated to avoid warpage.

Although the present invention has been described with reference to preferred embodiments, workers skilled in the art will recognize that changes may be made in form and detail without departing from the spirit and scope of the invention.

What is claimed is:

1. A system for detaching a component from a first surface of a circuit board, the component being surface mounted to the first surface by solid conductive connections that establish electrical conduction between the component and the circuit board and provides mechanical support for the component on the circuit board, the circuit board having a second surface, opposite the first surface, supporting printed wires, the solid conductive connections having a predetermined melting temperature, the system comprising:

a chamber for containing an inert liquid, the liquid having a level that is adjustable within the chamber;

a first mount for supporting a circuit board so that a component attached to the circuit board is below the circuit board and in the chamber;

a resilient mount at least partially in the chamber and at least partially below the component for supporting the component after it is detached from the circuit board and biasing the component against the circuit board;

a heater for heating inert liquid in the chamber to above the predetermined melting temperature; and fluid level adjustment means for adjusting the level of inert liquid in the chamber between a first level below the component wherein the component is free of the inert liquid and a second level above the component wherein the component is immersed in the inert liquid, so that solid conductive connections between the component and the circuit board may be uniformly melted by raising the level of the inert liquid in the chamber from its first level to its second level to immerse the component and the conductive connections in the inert liquid and the circuit board may be detached from the first mount leaving the component supported by the resilient mount.

2. The system of claim 1, wherein the resilient mount is supported by the chamber for supporting the component parallel to the level of the inert liquid in the chamber and for supporting the component after it is detached from the circuit board.

3. A system for surface attaching a component to a first surface of a circuit board with solid conductive connections that establish electrical conduction between the component and the circuit board and provides mechanical support for the component on the circuit board, the circuit board having a second surface, opposite the first surface, supporting printed wires, at least one of the circuit board and the component having a plurality of solid conductive beads attached thereto, the beads having a predetermined melting temperature so that upon melting and resolidifying the beads provide mechanical and electrical connection between the component and the circuit board, the system comprising:

a chamber for containing an inert liquid to a level that is adjustable within the chamber;

a first mount for supporting a circuit board;

a resilient mount at least partially in the chamber and at least partially below the component for supporting the component below the circuit board and for biasing the component against the circuit board, the first and resilient mounts being arranged so that the beads are sandwiched between the component and the circuit board;

a heater for heating inert liquid in the chamber to above the predetermined melting temperature; and fluid level adjustment means for adjusting the level of inert liquid in the chamber between a first level below the component wherein the component is free of the inert liquid and a second level above the component wherein the component is immersed in the inert liquid, so that the beads sandwiched between the component and the circuit board are uniformly melted by raising the level of the inert liquid in the chamber from its first level to its second level to immerse the component and the beads in the inert liquid and resolidify by lowering the level of the inert liquid in the chamber from its second level to its first level to remove the component and beads from the inert liquid while the resilient mount biases the component against the circuit board to thereby establish the solid conductive connections.

4. The system of claim 3, wherein the resilient mount supports the component parallel to level of the inert liquid in the chamber.

5. A system for selectively attaching or detaching a component with a first surface of a circuit board, the component being arranged for surface mounting to the first surface by solid conductive connections that establish electrical conduction between the component and the circuit board and provide mechanical support for the component on the circuit board, the circuit board having a second surface, opposite the first surface, supporting printed wires, at least one of the circuit board and the component having a plurality of solid conductive beads attached thereto when the system is operated to attach the component to the circuit board, the beads having a predetermined melting temperature so that upon melting and resolidifying the beads form the solid conductive connections that establish mechanical and electrical connection between the component and the circuit board, the solid conductive connections having the predetermined melting temperature, the system comprising:

a chamber for containing an inert liquid to a level that is adjustable within the chamber;

a first mount for supporting a circuit board;

a resilient mount at least partially in the chamber and at least partially below the component for supporting the component below the circuit board and for biasing the component against the circuit board, the resilient mount (i) supporting the component after it is removed from the circuit board when the system is operated to detach a component from a circuit board, and (ii) biasing the component against the circuit board when the system is operated to attach a component to a circuit board;

a heater for heating inert liquid in the chamber to above the predetermined melting temperature; and fluid level adjustment means for adjusting the level of inert liquid in the chamber between a first level below the component wherein the component is free of the inert liquid and a second level above the component wherein the component is immersed in the inert liquid, whereby when the system is operated to detach a component from a circuit board, the first mount supports the circuit board so that a component attached to the circuit board is below the circuit board and in the and solid conductive connections between the component and the circuit board are uniformly melted by raising the level of the inert liquid in the chamber from its first level to its second level to immerse the component and connections in the inert liquid and the circuit board may be removed from the first mount leaving the component supported by the resilient mount, and whereby when the system is operated to attach a component to a circuit board, the first mount and the resilient mount are arranged so that the beads are sandwiched between the component and the circuit board and the beads are uniformly melted by raising the level of the inert liquid in the chamber from its first level to its second level to immerse the component and beads in the inert liquid and may be resolidified by lowering the level of the inert liquid in the chamber from its second level to its first level to remove the component and beads from the inert liquid while the resilient mount biases the component against the circuit board to thereby establish the solid conductive connections.

6. The system of claim 5, wherein the resilient mount supports the component parallel to level of the inert liquid in the chamber.

* * * * *

UNITED STATES PATENT AND TRADEMARK OFFICE
CERTIFICATE OF CORRECTION

PATENT NO. : 5,740,954
DATED : APRIL 21, 1998
INVENTOR(S) : DEEPAK KESHAV PAI, ALLEN LEE BRINGEWATT

It is certified that error appears in the above-indentified patent and that said Letters Patent is hereby corrected as shown below:

Col. 1, line 46, delete "Pal et al.,", insert --Pai et al."

Signed and Sealed this

Seventeenth Day of November, 1998

Attest:

BRUCE LEHMAN

*Attesting Officer*      *Commissioner of Patents and Trademarks*